United States Patent
Haywood

(10) Patent No.: US 9,323,458 B2
(45) Date of Patent: *Apr. 26, 2016

(54) MEMORY BUFFER WITH ONE OR MORE AUXILIARY INTERFACES

(71) Applicant: INPHI CORPORATION, Santa Clara, CA (US)

(72) Inventor: Christopher Haywood, Thousand Oaks, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/665,968

(22) Filed: Mar. 23, 2015

(65) Prior Publication Data

US 2015/0261442 A1    Sep. 17, 2015

Related U.S. Application Data

(63) Continuation-in-part of application No. 14/228,673, filed on Mar. 28, 2014, now Pat. No. 8,990,488, which is a continuation of application No. 13/359,877, filed on Jan. 27, 2012, now Pat. No. 8,694,721.

(60) Provisional application No. 61/473,889, filed on Apr. 11, 2011.

(51) Int. Cl.
*G06F 3/06* (2006.01)
*G06F 13/16* (2006.01)
*G11C 7/10* (2006.01)

(52) U.S. Cl.
CPC ............ *G06F 3/0604* (2013.01); *G06F 3/0659* (2013.01); *G06F 3/0685* (2013.01); *G06F 3/0688* (2013.01); *G06F 13/1642* (2013.01); *G06F 13/1673* (2013.01); *G06F 13/1694* (2013.01); *G11C 7/1072* (2013.01)

(58) Field of Classification Search
CPC ............ G06F 13/1642; G06F 13/1694; G06F 3/0604; G06F 3/0659; G06F 3/0685; G06F 13/1673; G06F 9/544; G06F 2212/7203; G06F 3/0688; G06F 13/00; G11C 16/06; G11C 7/1072

See application file for complete search history.

(56) References Cited

U.S. PATENT DOCUMENTS

| | | | |
|---|---|---|---|
| 2007/0162670 A1* | 7/2007 | Yang et al. | 710/100 |
| 2008/0177940 A1* | 7/2008 | Risse | 711/105 |
| 2008/0183959 A1* | 7/2008 | Pelley et al. | 711/109 |
| 2010/0005281 A1* | 1/2010 | Buchmann et al. | 713/2 |
| 2012/0102554 A1* | 4/2012 | Emerick et al. | 726/6 |
| 2012/0257459 A1* | 10/2012 | Berke | 365/189.02 |

* cited by examiner

*Primary Examiner* — Hashem Farrokh
(74) *Attorney, Agent, or Firm* — Koppel, Patrick, Heybl & Philpott

(57) ABSTRACT

The present memory system includes a memory buffer having an interface arranged to buffer data and/or command bytes being written to or read from the RAM chips residing on a DIMM by a host controller. The memory buffer further includes at least one additional interface arranged to buffer data and/or command bytes between the host controller or RAM chips and one or more external devices coupled to the at least one additional interface. For example, the memory buffer may include a SATA interface and be arranged to convey data between the host controller or RAM chips and FLASH memory devices coupled to the SATA interface. The memory buffer may be employed in various types of systems, such as a computer server system, a network system, or a data center.

21 Claims, 6 Drawing Sheets

MEMORY BUFFER WITH ONE OR MORE AUXILIARY INTERFACES

RELATED APPLICATIONS

This application is a Continuation-in-Part of U.S. utility application Ser. No. 14/228,673, filed Mar. 28, 2014, still pending, which is a Continuation of U.S. utility application Ser. No. 13/359,877, filed Jan. 27, 2012, which issued as U.S. Pat. No. 8,694,721 on Apr. 8, 2014, which claimed the benefit of provisional patent application No. 61/473,889 to Haywood, filed Apr. 11, 2011.

BACKGROUND OF THE INVENTION

1. Field of the Invention

This invention relates generally to memory systems, and more particularly to memory systems which include a memory buffer that serves as an interface between a host controller and the RAM chips residing on a DIMM.

2. Description of the Related Art

Traditional computer systems, such as servers, workstations, desktops and laptops, all use pluggable memory which can be inserted into slots on the computer's motherboard as needed. The most common form of pluggable memory is the DIMM. Historically, DIMMs contain multiple RAM chips—typically DRAM—each of which has a data bus width of 4 or 8 bits. Typically, eight or nine 8-bit DRAM chips (or twice as many 4-bit DRAM chips) are arranged in parallel to provide each DIMM with a total data bus width of 64 or 72 bits; the data bus, typically referred to as the 'DQ' bus, is connected to a host controller. Each arrangement of 64 or 72 data bits using DRAM chips in parallel is termed a 'rank'.

A command/address (CA) bus also runs between the host controller and each DIMM; the CA and DQ busses together form a 'system' bus. With a basic unbuffered DIMM, the CA bus is connected to every DRAM on the DIMM. As a result, there is a high electrical load on the CA bus, given by the product of the number of DRAMs times the number of ranks. For the DQ bus, the number of electrical loads is equal to the number of ranks.

A buffering device is employed to reduce loading in a 'load reduction' DIMM (LR-DIMM), an example of which is illustrated in FIG. 1. An LR-DIMM 10 containing multiple DRAM chips 12 uses a logic device 14 to buffer the DQ and CA signals between the DRAMs and a host controller 16. Logic device 14 may be, for example, a single device such as the iMB (isolating Memory Buffer) from Inphi Corporation. Memory systems of this sort are described, for example, in co-pending U.S. patent application Ser. Nos. 12/267,355 and 12/563,308, which are incorporated herein by reference.

SUMMARY OF THE INVENTION

The present invention is directed to a memory system which includes a memory buffer having one or more auxiliary interfaces, which serve to expand the functionality of the memory buffer.

The present memory system includes a memory buffer having an interface arranged to buffer data and/or command bytes being written to or read from a plurality of RAM chips (typically DRAM) residing on a DIMM by a host controller. The memory buffer includes at least one additional interface arranged to buffer data and/or command bytes between the host controller or RAM chips and one or more external devices coupled to the at least one additional interface. For example, the memory buffer may include a SATA interface and be arranged to convey data between the host controller or RAM chips and FLASH memory devices coupled to the SATA interface. The additional interfaces may include, for example, a SATA interface, an Ethernet interface, an optical interface, and/or a radio interface. The memory buffer may reside on the DIMM along with the RAM chips with which it interfaces, or be separate from the DIMM. The present memory buffer may be employed in various types of systems, such as a computer server system, a network system, or a data center.

These and other features, aspects, and advantages of the present invention will become better understood with reference to the following description and claims.

DETAILED DESCRIPTION OF THE INVENTION

The present memory system includes one or more memory buffers, each of which is arranged to buffer data and/or command bytes being written to or read from the RAM chips residing on a DIMM by a host controller. Note that the RAM chips are referred to hereinafter as DRAM, though the invention is not limited to any specific memory chip type. The present memory system expands the functionality of the memory buffer in such a system by incorporating one or more additional interfaces which are arranged to provide respective functions. For example, the memory buffer might include a serial ATA (SATA) interface, such that in addition to serving as a buffer between a host controller and the DRAM, the memory buffer also serves as a buffer between the host controller and/or DRAM and external devices capable of interfacing with a SATA interface.

Figure 1:
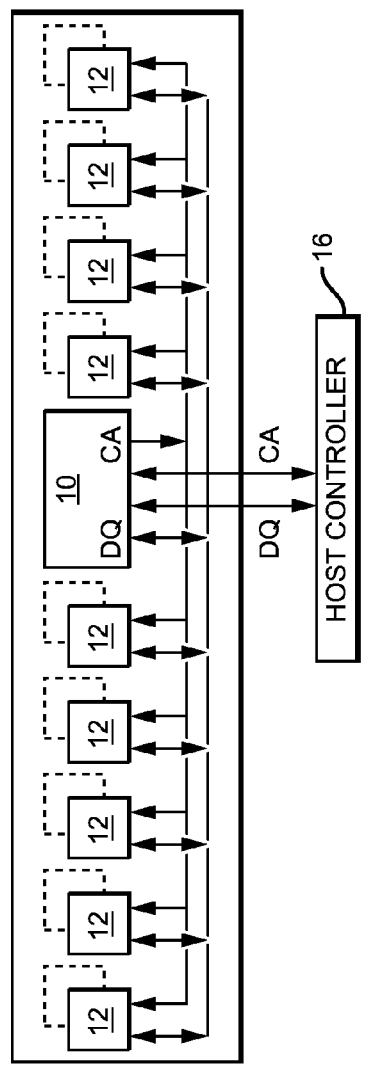
FIG. 1 is a block diagram of a known memory system which includes a DIMM containing a memory buffer.
Figure 2A:
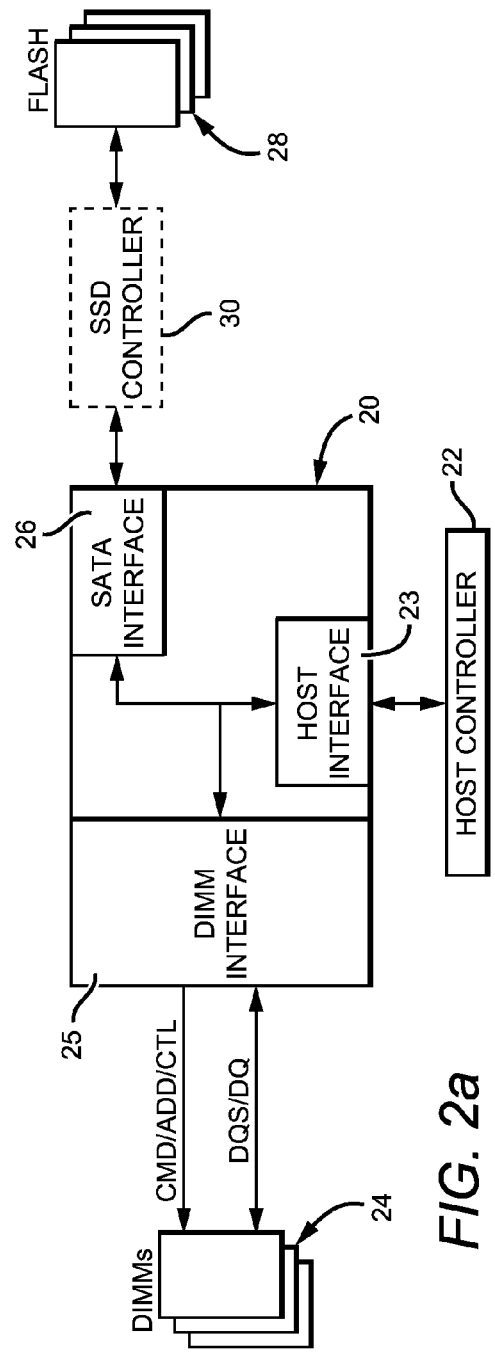
FIG. 2a is a block diagram of a memory system which includes a memory buffer in accordance with the present invention.

One possible embodiment of this concept is shown in FIG. 2a. A memory buffer 20 interfaces with a host controller 22 via a host interface 23, and operates as a buffer for the command and data lines connected to the DRAM residing on one or more DIMMs 24 via a DIMM interface 25. Memory buffer 20 also includes a SATA interface 26, such that memory buffer 20 also operates as a buffer between host controller 22 and/or DIMM 24 and any devices connected to and capable of being controlled via the SATA interface. For example, FLASH memory devices 28, or any other non-volatile memory type, might be connected to SATA interface 26 via a controller 30, such that data from host controller 22 or DIMM 24 can be written to the FLASH memory via SATA interface 26. In general, the external devices may be connected directly to a memory buffer's additional interfaces, or be coupled to them via intervening controller devices such as controller 30, as needed. Note that as used herein, "FLASH" memory is intended to encompass both conventional FLASH memory as well as any other non-volatile memory type.

The approach described herein is applicable to any memory system that employs a memory buffer which serves as an interface between the individual memory chips on a DIMM and a host controller, as long as the system is capable of providing full control of the memory chips to the memory buffer. Memory systems to which the present system might be adapted include systems in accordance with the DDR3, load-reduced DIMM (LRDIMM), registered or unregistered DIMM (RDIMM, UDIMM), non-volatile DIMM (NV-DIMM), or any DDR interface standard specifications.

A NV-DIMM system operates to write RAM data to FLASH memory in the event of a power loss. As such, a NV-DIMM system is well-suited for use with the present system: a SATA interface might be included within a memory buffer which interfaces with one or more a NV-DIMMs (per the arrangement shown in FIG. 2); then, data stored in the DRAMs can be efficiently written to the FLASH memory if power is lost.

A SATA interface is merely one example of an interface that could be added to a memory buffer as described above. Other possible interfaces include an Ethernet interface, optical interface, and/or a radio interface, as well as interfaces capable of interfacing with additional known or future memory element types including, but not limited to, FLASH and DRAM.

Memory buffer 20 may be an IC that is separate and distinct from the DIMM ICs 24, as shown in FIG. 2a. In this case, the DIMMs may be standard DIMMs—i.e., with no modifications needed to operate with the present memory system.

Figure 2B:
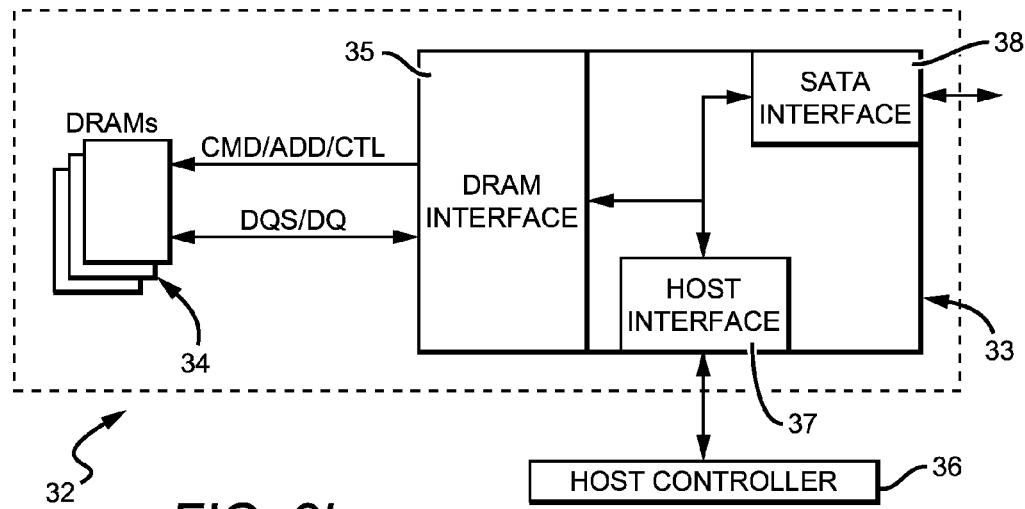
FIG. 2b is a block diagram of a memory system which includes a memory buffer in accordance with the present invention, in which the memory buffer resides on a DIMM.

Alternatively, the memory buffer may reside on the DIMM containing the DRAM with which it interfaces. This is illustrated in FIG. 2b. Here, a DIMM 32 includes a memory buffer 33 as described herein. The DIMM includes a plurality of DRAM chips 34, and memory buffer 33 includes an interface 35 arranged to buffer data and/or command bytes being written to or read from the DRAM by a host controller 36 via an interface 37, and further includes at least one additional interface 38 arranged to buffer data and/or command bytes between host controller 36 and/or DRAM 34 and one or more external devices coupled to the at least one additional interface.

When the memory buffer resides on the DIMM as shown in FIG. 2b, it is likely that the DIMM will need to deviate from a standard form in order to accommodate either the memory buffer and/or additional interfaces 37. The deviation from a standard form may also require additional I/O connectivity, to accommodate the data being handled by additional interfaces 37. This may require, for example, that additional I/O pins be added to the DIMM's main connector, or that the DIMM include one or more connectors in addition to the DIMM's main connector.

As noted above, the approach described herein is applicable to any memory system that employs a memory buffer which serves as an interface between the individual memory chips on a DIMM and a host controller, as long as the system is capable of providing full control of the memory chips to the memory buffer. In previous memory systems which employ a memory buffer, the buffer is typically a 'slave' device, arranged such that most of the commands it receives from the host controller are simply passed through to the DIMM interface—i.e., the memory buffer does not control the DIMM interface of its own accord. However, to use the additional interfaces, the memory buffer has to have full control of the DRAM chips so that it can read and write between the DRAM and the additional interfaces, as well as preferably do general housekeeping and power management.

Control can be given to the memory buffer in several ways or under several conditions. For example, the change of control can occur when the memory system power fails, is indeterminate, and/or is restored. Full control of the DRAM might also be given to the memory buffer via direct or indirect command from the host controller. A direct command would take the form of a special command or signal sent by the host to the buffer. An indirect command could occur when, for example, control is transferred to the memory buffer when the host is not going to access the DRAM for a predetermined about of time, thereby providing some opportunistic access to the memory buffer during this downtime.

Figure 3:
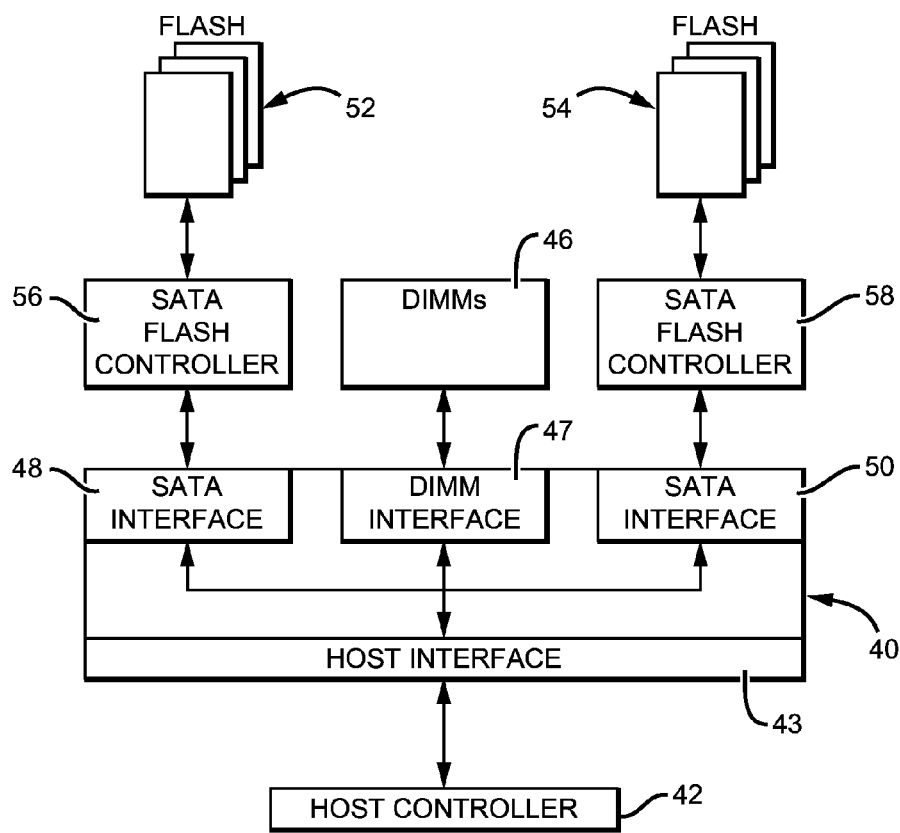
FIG. 3 is another possible embodiment of a memory system containing a memory buffer in accordance with the present invention.

Multiple interfaces of the same type, or of different types, can be incorporated into the memory buffer as needed. An exemplary embodiment illustrating the addition of two such interfaces is shown in FIG. 3. Here, a memory buffer 40 interfaces with a host controller 42 via a host interface 43, and operates as a buffer for the command and data lines connected to one or more DIMMs 46 via a DIMM interface 47. Memory buffer 40 also includes two SATA interfaces 48, 50 such that memory buffer 40 may also operate as a buffer between host controller 42 or DIMMs 46 and external devices capable of interfacing with a SATA interface, such as FLASH memory devices 52, 54 connected to SATA interfaces 48, 50 via one or more controllers 56, 58. This sort of configuration can be implemented with memory buffer 40 being separate from DIMMs 46 as illustrated in FIG. 3; alternatively, memory buffer 40 could be implemented on the DIMM containing the DRAM with which it interfaces.

Figure 4:
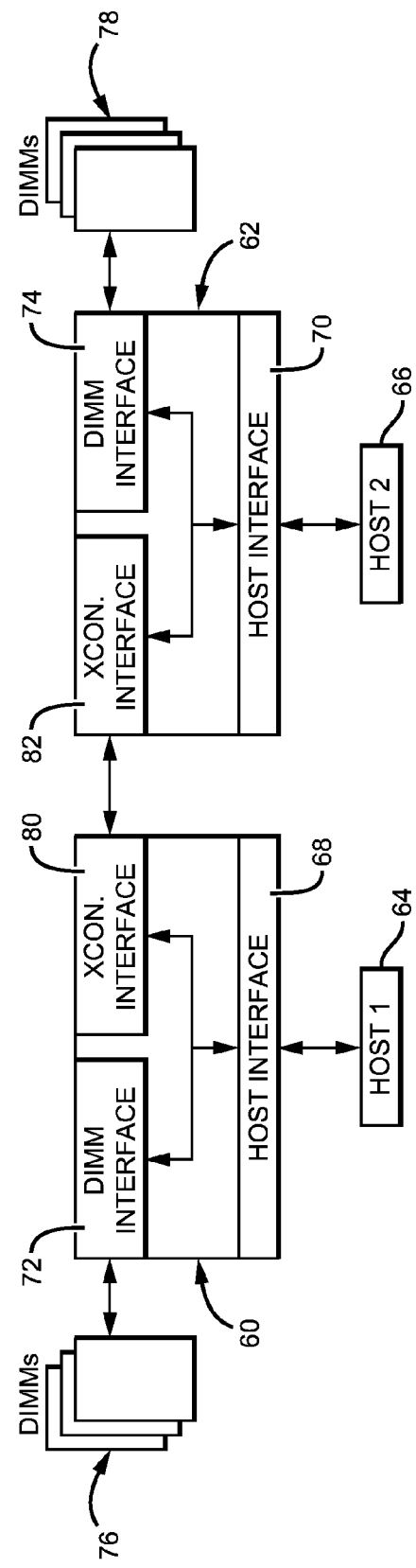
FIG. 4 is an embodiment of a memory system which includes two memory buffers in accordance with the present invention.

A memory system which includes a memory buffer per the present system might also include an interface which enables two or more host controllers to be 'cross-connected', so as to enable memory and/or data sharing between hosts. An exemplary embodiment is shown in FIG. 4. Memory buffers 60 and 62 interface with host controllers 64, 66 via respective host interfaces 68, 70. Each buffer also includes a DIMM interface 72, 74 which operates as a buffer for the command and data lines connected to DIMMs 76, 78. Memory buffer 60 also includes a cross-connect interface 80, which is arranged to buffer data and/or command bytes between host controller 64 or DIMMs 76 and external devices connected to interface 80. Similarly, memory buffer 62 includes a cross-connect interface 82 arranged to buffer data and/or command bytes between host controller 66 or DIMMs 78 and external devices connected to interface 82. When cross-connect interfaces 80 and 82 are coupled together as shown, memory buffers 60 and 62 can operate as buffers between each other, as well as between host controllers 64 and 66, enabling data and/or command bytes to be exchanged between the DIMMs and/or host controllers via the cross-connect interfaces. As with the other embodiments described herein, this sort of configuration can be implemented with memory buffers 60 and 62 being separate from DIMMs 76 and 78 as illustrated in FIG. 4; alternatively, memory buffers 60 and 62 could be implemented on the DIMMs containing the DRAM with which they interface (DIMMs 76 and 78, respectively).

Figure 5:
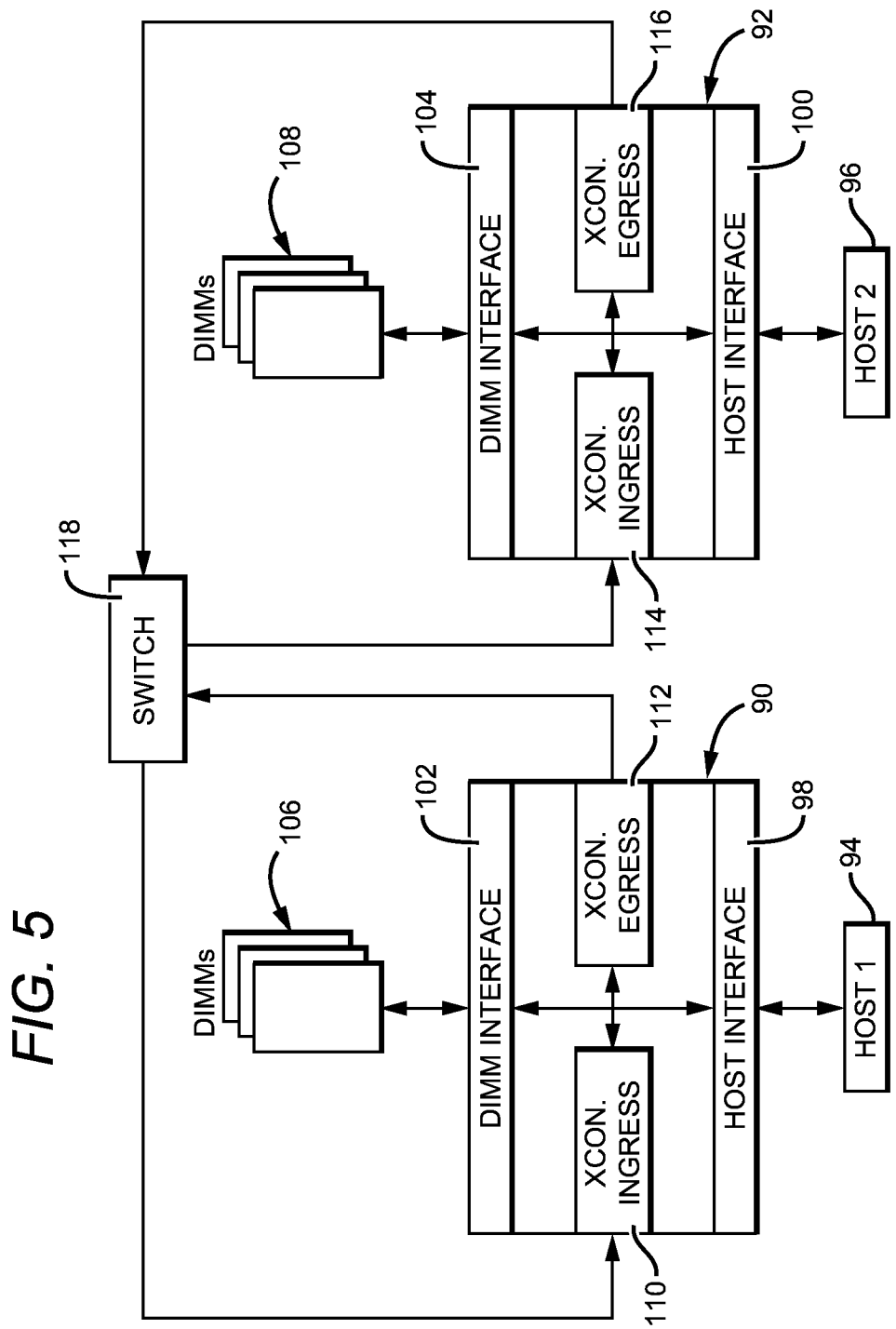
FIG. 5 is another possible embodiment of a memory system which includes memory buffers in accordance with the present invention.

Another possible embodiment is shown in FIG. 5, in which memory buffers per the present system enable two or more DIMMs and/or host controllers to be 'cross-connected' via a switch. Memory buffers 90 and 92 interface with host controllers 94, 96 via respective host interfaces 98, 100. Each memory buffer also includes a DIMM interface 102, 104 which operates as a buffer for the command and data lines connected to one or more DIMMs 106, 108. Each memory buffer also includes an ingress and an egress cross-connect interface (110 and 112 for buffer 90, 114 and 116 for buffer 92), which are connected to a switch 118. The switch can be arranged to enable unidirectional communication (in either direction), or bidirectional communication, between the respective cross-connect interfaces—thereby enabling data and/or command bytes to be exchanged between the DIMMs and/or host controllers via the cross-connect interfaces.

Figure 6:
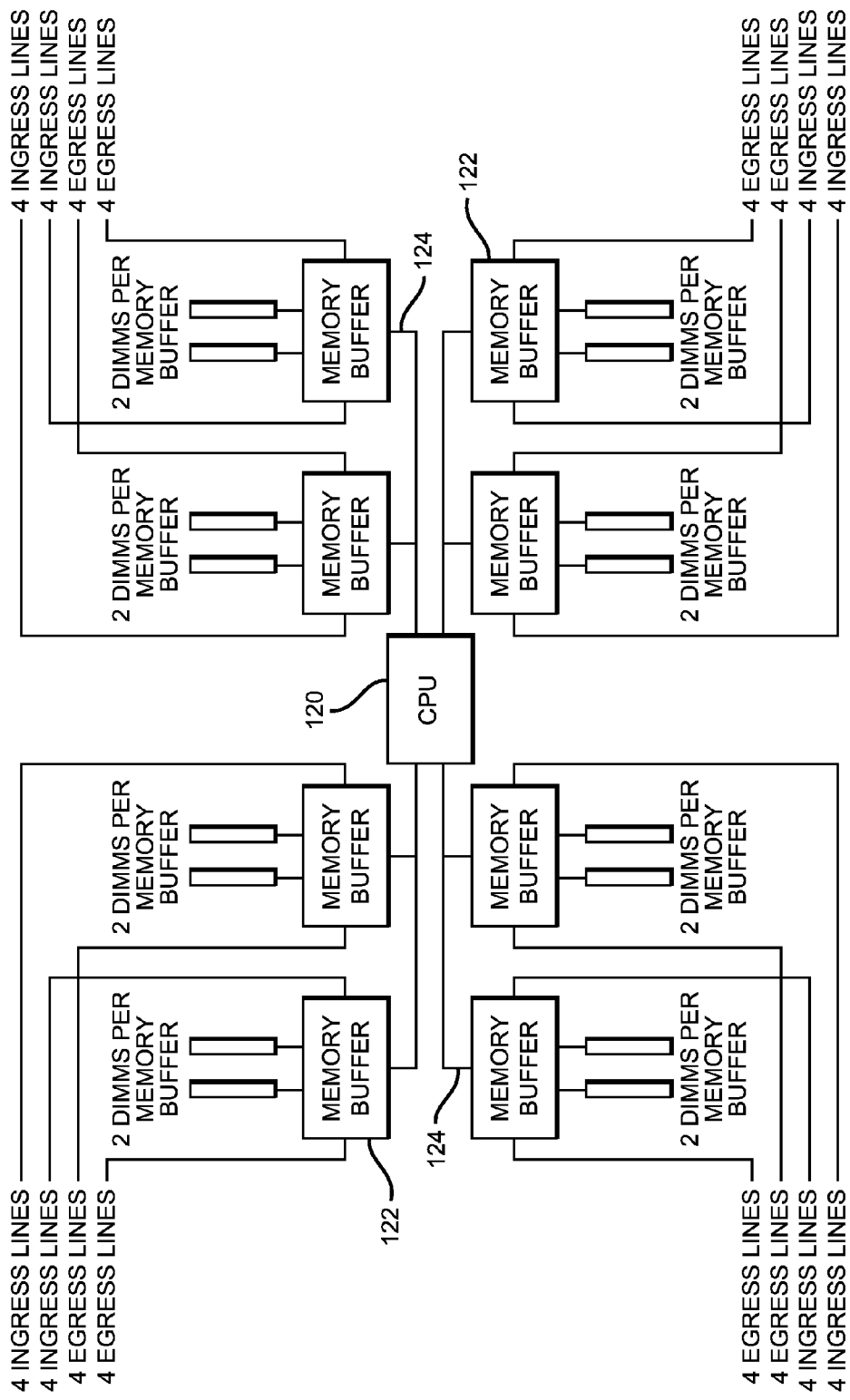
FIG. 6 is an embodiment of a memory system which includes a plurality of memory buffers in accordance with the present invention.

Another possible embodiment is shown in FIG. 6. Here, a common host (CPU 120) is connected to multiple memory buffer chips 122 via memory channels 124; each memory buffer chip is in turn coupled to one or more DIMMs (2 DIMMs in the example shown in FIG. 6). Each memory buffer has been adapted as described herein to include one or more additional interfaces; here, each buffer includes an ingress interface and an egress interface, which can be connected to each other and to additional external devices as needed.

A memory buffer as described herein may also include a direct memory access (DMA) controller capable of writing data to or reading data from the DIMMs containing the DRAM with which the memory buffer interfaces, and conveying data between the DIMM and one or more of the memory buffer's additional interfaces. For example, if the memory buffer includes a SATA interface, the DMA controller may be arranged to exchange data between the DIMMs and the SATA interface.

Some memory buffers includes a self-test engine capable of reading data from the DIMM and comparing it with one or more data patterns; for example, the MemBIST (Memory Built-In Self Test) engine is incorporated into the iMB memory buffer from Inphi Corp. One function of a self-test engine of this sort might be to test the integrity of a DIMM's DRAM by reading data from it and comparing it against an expected pattern stored in the memory buffer; an 'error' occurs if the data does not match the expected pattern, in which case the offending DRAM address is logged and the test continues. By changing the polarity of the error signal generated by the self-test engine, it is possible to change the operation performed by the self-test engine from 'test' to 'search'. In this case, when a pattern read from DRAM matches a pattern stored or inputted into the memory buffer, the DRAM address of the "found" data is logged and the search continues. This search capability could be extended so that there are multiple possible match patterns, as well as "don't care" bits, which would enable searches to be executed for multiple patterns in parallel with wild cards.

Note that a memory buffer as described herein could be implemented as a single integrated circuit (IC), or with a multiple chip chipset with various functions spread among several ICs. For example, a memory system based on the DDR4 standard employs DIMMs which include 9 separate data buffer chips arranged close to the connector contacts and which provide an interface between the connector and the DRAMs, and a central control element which functions as the register section of the DIMM and includes an extra interface to control the data buffers. For this type of chipset implementation, implementing an auxiliary port as described herein requires a path from the data buffers to the central controller.

The embodiments shown in the figures and described above are merely exemplary. The present system encompasses any memory system which employs a memory buffer that serves as an interface between the individual memory chips on a DIMM and a host, and which includes at least one additional interface which enables the memory buffer to serve as an interface between the host and/or memory chips and additional external devices.

The present memory buffer may be employed in various types of systems, such as a computer server system, a network system, or a data center. Computer servers typically provide data to other computers, often over a local area network (LAN) or a wide area network (WAN) over the Internet. All computer servers include internal memory systems which include RAM, and thus might benefit from a memory buffer with one or more auxiliary interfaces as described herein. For example, the ability to connect FLASH memory to a server's memory system via an auxiliary SATA interface on a memory buffer provides a simple and efficient method of increasing the server's memory capacity. Similarly, providing a memory buffer with an auxiliary Ethernet interface provides a simple method of conveying server data to and from a network such as the Internet coupled to the Ethernet interface. Multiple computer servers can be interconnected by means of a network, and/or assembled into a data center.

The present memory buffer might also find application in a network context. Networks enable the sharing of files and information between multiple computer systems. As such, the present memory buffer might find use in the internal memory systems of one or more computer systems on a given network, as described above. Alternatively, one or more stand-alone memory systems which include a memory buffer with one or more auxiliary interfaces as described herein could be coupled to a given network. As noted above, a memory buffer with an auxiliary SATA interface could be used to provide the network with additional memory capacity; an auxiliary Ethernet interface could provide a convenient means of coupling the network to another network, such as the Internet.

Memory buffers as described herein could also be employed in data centers. A data center is a facility used to house multiple computer systems and associated components, such as telecommunications and storage systems. Many data centers are run by Internet service providers, solely for the purpose of hosting their own and third party servers. The server or computer systems in a data center include internal memory systems which include RAM, and thus might benefit from a memory buffer with one or more auxiliary interfaces as described herein. For example, as noted above, the ability to connect FLASH memory to a data center server's memory system via an auxiliary SATA interface on a memory buffer provides a simple and efficient method of increasing the server's memory capacity.

Figure 7:
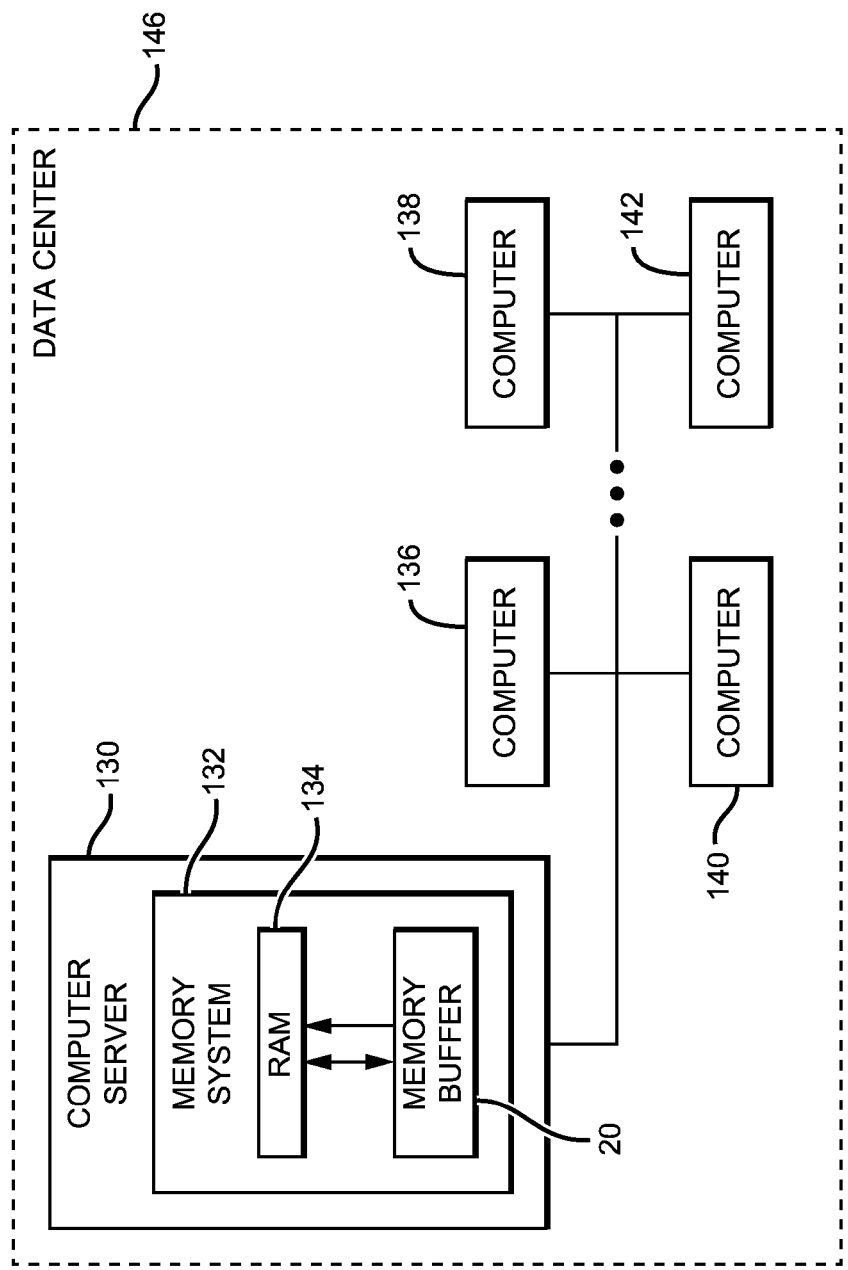
FIG. 7 is a block diagram illustrating the use of the present invention in a computer server, a network and a data center.

These possible applications are illustrated in FIG. 7. A computer server 130 includes a memory system 132, which comprises RAM 134 and a memory buffer with one or more auxiliary interfaces—such as memory buffer 20 described above. Server 130 can be interconnected with other computer and/or server systems 136, 138, 140, 142 by means of a network 144. An aggregation 146 of such interconnected computer and/or server systems can be employed as a data center.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A computer server system, comprising:
   at least one computer server, comprising:
      a memory system, comprising:

a plurality of random access memory (RAM) chips; and a memory buffer which includes an interface arranged to buffer data and/or command bytes being written to or read from said plurality of RAM chips by a first host controller;

said memory buffer further comprising at least one additional interface arranged to buffer data and/or command bytes between said first host controller and/or said RAM chips and one or more external devices coupled to said at least one additional interface, wherein said at least one additional interface includes an interface comprising a SATA interface, an Ethernet interface, an optical interface, or a radio interface.

2. The computer server system of claim 1, wherein said plurality of RAM chips reside on one or more DIMMs.

3. The computer server system of claim 2, wherein said memory buffer is an integrated circuit (IC) and each of said DIMMs is an IC, said memory buffer IC being separate from said DIMM ICs.

4. The computer server system of claim 1, further comprising an external controller device arranged to operate as an interface between said memory buffer's at least one additional interface and said one or more external devices.

5. The computer server system of claim 1, wherein said one or more external devices comprise FLASH memory devices.

6. The computer server system of claim 1, wherein said memory buffer further comprises a direct memory access (DMA) controller capable of writing data to or reading data from said RAM chips and conveying said data between the RAM chips and one or more of said memory buffer's additional interfaces.

7. The computer server system of claim 1, said system comprising two or more of said computer servers, said computer servers interconnected by means of a network.

8. The computer server system of claim 7, wherein said interconnected computer servers form a data center.

9. A network system, comprising:
a network of interconnected computer systems comprising one or more memory systems, at least one of which comprises a memory buffer, said memory buffer comprising:
an interface arranged to buffer data and/or command bytes being written to or read from a plurality of RAM chips by a first host controller; and
at least one additional interface arranged to buffer data and/or command bytes between said first host controller and/or said RAM chips and one or more external devices coupled to said at least one additional interface, wherein said at least one additional interface includes an interface comprising a SATA interface, an Ethernet interface, an optical interface, or a radio interface.

10. The network system of claim 9, wherein said plurality of RAM chips reside on one or more DIMMs.

11. The network system of claim 10, wherein said memory buffer is an integrated circuit (IC) and each of said DIMMs is an IC, said memory buffer IC being separate from said DIMM ICs.

12. The network system of claim 9, further comprising an external controller device arranged to operate as an interface between said memory buffer's at least one additional interface and said one or more external devices.

13. The network system of claim 9, wherein said one or more external devices comprise FLASH memory devices.

14. The network system of claim 9, wherein said memory buffer further comprises a direct memory access (DMA) controller capable of writing data to or reading data from said RAM chips and conveying said data between the RAM chips and one or more of said memory buffer's additional interfaces.

15. The network system of claim 9, wherein said computer systems comprise at least one computer server, said servers interconnected to the other of said computer systems via said network.

16. The network system of claim 9, wherein said interconnected computer systems form a data center.

17. The network system of claim 9, further comprising at least one stand-alone memory system, at least one of which comprises a memory buffer, said memory buffer comprising:
an interface arranged to buffer data and/or command bytes being written to or read from a plurality of RAM chips by a first host controller; and
at least one additional interface arranged to buffer data and/or command bytes between said first host controller and/or said RAM chips and one or more external devices coupled to said at least one additional interface.

18. A data center, comprising:
a plurality of computer systems, at least one of which comprises a memory system comprising:
a plurality of random access memory (RAM) chips; and
a memory buffer which includes an interface arranged to buffer data and/or command bytes being written to or read from said plurality of RAM chips by a first host controller;
said memory buffer further comprising at least one additional interface arranged to buffer data and/or command bytes between said first host controller and/or said RAM chips and one or more external devices coupled to said at least one additional interface, wherein said at least one additional interface includes an interface comprising a SATA interface, an Ethernet interface, an optical interface, or a radio interface;
said computer systems networked together to form a data center.

19. The data center of claim 18, wherein said one or more external devices comprise FLASH memory devices.

20. The data center of claim 18, wherein said plurality of RAM chips reside on one or more DIMMs.

21. The data center of claim 20, wherein said DIMM is in compliance with the DDR3, load-reduced DIMM (LRDIMM), registered DIMM (RDIMM), unregistered DIMM (UDIMM), or non-volatile DIMM (NV-DIMM) specifications.

* * * * *